(12) United States Patent
Umbarger et al.

(10) Patent No.: US 11,475,191 B2
(45) Date of Patent: Oct. 18, 2022

(54) GENERATING AND ADDING ADDITIONAL CONTROL INFORMATION TO LOGIC UNDER TEST TO FACILITATE DEBUGGING AND COMPREHENSION OF A SIMULATION

(71) Applicant: International Business Machines Corporation, Armonk, NY (US)

(72) Inventors: Paul Umbarger, Austin, TX (US); Debapriya Chatterjee, Austin, TX (US); Karen Yokum, Austin, TX (US); John A. Schumann, Austin, TX (US); Bryant Cockcroft, Austin, TX (US); Kevin Barnett, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 582 days.

(21) Appl. No.: 16/412,688

(22) Filed: May 15, 2019

(65) Prior Publication Data
US 2020/0364313 A1 Nov. 19, 2020

(51) Int. Cl.
*G06F 30/33* (2020.01)
*G06F 30/327* (2020.01)

(52) U.S. Cl.
CPC ............ *G06F 30/33* (2020.01); *G06F 30/327* (2020.01)

(58) Field of Classification Search
CPC ...... G06F 30/20; G06F 30/00; G06F 11/3608; G06F 11/3447; G06F 30/33; G06F 30/327
See application file for complete search history.

(56) References Cited

U.S. PATENT DOCUMENTS

| 5,327,361 A * | 7/1994 | Long .................. G06F 11/3466 703/15 |
| 6,195,627 B1 | 2/2001 | Bargh et al. |
| 7,254,115 B1 * | 8/2007 | Lakhanpal ............. H04L 43/18 370/257 |
| 7,278,073 B2 | 10/2007 | Kimelman et al. |
| 7,529,653 B2 | 5/2009 | Frankel et al. |
| 8,050,903 B1 | 11/2011 | Bosshart et al. |
| 2005/0010880 A1 * | 1/2005 | Schubert .......... G01R 31/31705 716/106 |

(Continued)

OTHER PUBLICATIONS

Mell et al., "The NIST Definition of Cloud Computing—Recommendations of the National Institute of Standards and Technology"; U.S. Department of Commerce; Sep. 2011; 7 pages.

*Primary Examiner* — Rehana Perveen
*Assistant Examiner* — Cuong V Luu
(74) *Attorney, Agent, or Firm* — Cantor Colburn LLP; Brian Restauro (57) ABSTRACT

Provided are systems, methods, and media for handling simulation of logic under test. An example method includes receiving a simulation model for the logic under test. Generating second logic that is configured to create a set of output logic signals based on an existing set of input logic signals of the logic under test. Rebuilding the simulation model based, at least in part, on the second logic. Examining a netlist of the rebuilt simulation model to identify the set of output logic signals created by the second logic. Generating during the execution of the simulation, a bus trace that is configured to capture at least the identified set of output logic signals.

14 Claims, 9 Drawing Sheets

(56) References Cited

U.S. PATENT DOCUMENTS

2015/0220677 A1* 8/2015 Sehgal .................. G06F 30/398
  716/112
2017/0115348 A1* 4/2017 Schelle .............. G01R 31/3177
2018/0246795 A1 8/2018 Muthiah et al.

* cited by examiner

```
-- Statemachine for tracking data beats
---------------------------------------------------
-- inputs from designL
    --  clock: synchronous clock used to drive and capture the data bus
    --  data_valid: control signal indicating the current data_beat is valid
    --  data_beat(127 downto 0): The data comprising one beat of the data
packet
-- Tell Bugspray which clock to use for latches
--!! clock: ( clock, NOT clock);
-- Create a 2 bit grey-code state machine that advances when data_valid
is active
--!!
-- Create a signal with the next grey code
--!! bil_next_grey(1 downto 0) <= bil_curr_st(0) &
--!!                  NOT bil_curr_st(1);
--!! bil_next_st(1 downto 0)  <= bil_next_grey when (data_valid == '1')
--!!                 else bil_curr_st;
--!! bil_curr_st(1 downto 0) <= [bil_next_st(1 downto 0)];
--   The square brackets tell the Bugspray tool this is a latch
--   it uses the clock defined above
--!!
--!! bil_sm_zero <= (bil_curr_st(1 downto 0) = "00"); -- first beat
--!! bil_sm_two  <= (bil_curr_st(1 downto 0) = "10"); -- last beat
-- Create 4 bit decrementer to count raw data packets
--!! bil_count_zero <= '1' when (bil_count_out == "0000") else '0';
--   load the counter if it is zero (indicating this is a control packet)
--   and the current beat is the last beat (when data length field is valid)
--!! bil_load_count <= bil_count_zero AND bil_sm_two;
--!! bil_decr_count <= bil_sm_zero AND NOT bil_count_zero;
--!! bil_count_in(3 downto 0) <= data_beat(67 downto 64) when
(bil_load_count == '1') else
--!!           bil_count_m1            when (bil_decr_count == '1');
-- Create the decremented count
--!! bil_count_m1(3 downto 0) <= bil_count_out - "0001";
--!! bil_count_in(3 downto 0) <= [bil_count_in(3 downto 0)];
-- Create the desired extra control signals
--!! bil_data_pkt_start  <= data_valid AND   bil_sm_zero;
--!! bil_control_not_data <= bil_data_pkt_start AND bil_count_zero;
```

GENERATING AND ADDING ADDITIONAL CONTROL INFORMATION TO LOGIC UNDER TEST TO FACILITATE DEBUGGING AND COMPREHENSION OF A SIMULATION

BACKGROUND

The present invention generally relates to logic simulators, and more specifically, to generating and adding additional control information to logic under test to facilitate debugging and comprehension of a simulation.

Simulators are often used to test the integrity of a design such as to verify the functionality of a complex processor and/or system. The simulator simulates functions performed by a circuit and allows for examining signals that are generated by the design. From these signals, the errors may be detected in the designed processor or system. In the event that a design error is found, the simulator may facilitate modifying the design and then rerunning the simulation. One example simulator is a logic simulator for testing logic that is to be performed by a processor and/or system design.

SUMMARY

Embodiments of the present invention provide a computer-implemented method for handling simulation of logic under test. A non-limiting example of the computer-implemented method includes receiving, by a system comprising one or more processors, a simulation model for the logic under test. The method includes generating, by the system, second logic that is configured to create a set of output logic signals based on an existing set of input logic signals of the logic under test. The method includes rebuilding, by the system, the simulation model based, at least in part, on the second logic. The method includes examining, by the system, a netlist of the rebuilt simulation model to identify the set of output logic signals created by the second logic. The method includes executing, by the system, a simulation based on the rebuilt simulation model. The method includes generating, by the system, during the execution of the simulation, a bus trace that is configured to capture at least the identified set of output logic signals.

Embodiments of the present invention provide a system for handling simulation of logic under test. A non-limiting example of the system includes one or more processor configured to perform a method. A non-limiting example method includes receiving, by the system, a simulation model for the logic under test. The method includes generating, by the system, second logic that is configured to create a set of output logic signals based on an existing set of input logic signals of the logic under test. The method includes rebuilding, by the system, the simulation model based, at least in part, on the second logic. The method includes examining, by the system, a netlist of the rebuilt simulation model to identify the set of output logic signals created by the second logic. The method includes executing, by the system, a simulation based on the rebuilt simulation model. The method includes generating, by the system, during the execution of the simulation, a bus trace that is configured to capture at least the identified set of output logic signals.

Embodiments of the invention provide a computer program product for handling simulation of logic under test, the computer program product comprising a computer readable storage medium having program instructions embodied therewith. The program instructions are executable by system having one or more processors processor to cause the system to perform a method. A non-limiting example of the method includes receiving, by the system, a simulation model for the logic under test. The method includes generating, by the system, second logic that is configured to create a set of output logic signals based on an existing set of input logic signals of the logic under test. The method includes rebuilding, by the system, the simulation model based, at least in part, on the second logic. The method includes examining, by the system, a netlist of the rebuilt simulation model to identify the set of output logic signals created by the second logic. The method includes executing, by the system, a simulation based on the rebuilt simulation model. The method includes generating, by the system, during the execution of the simulation, a bus trace that is configured to capture at least the identified set of output logic signals.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted, or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two-digit or three-digit reference numbers. With minor exceptions (e.g., FIGS. 1-2), the leftmost digit of each reference number corresponds to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems; storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 1:
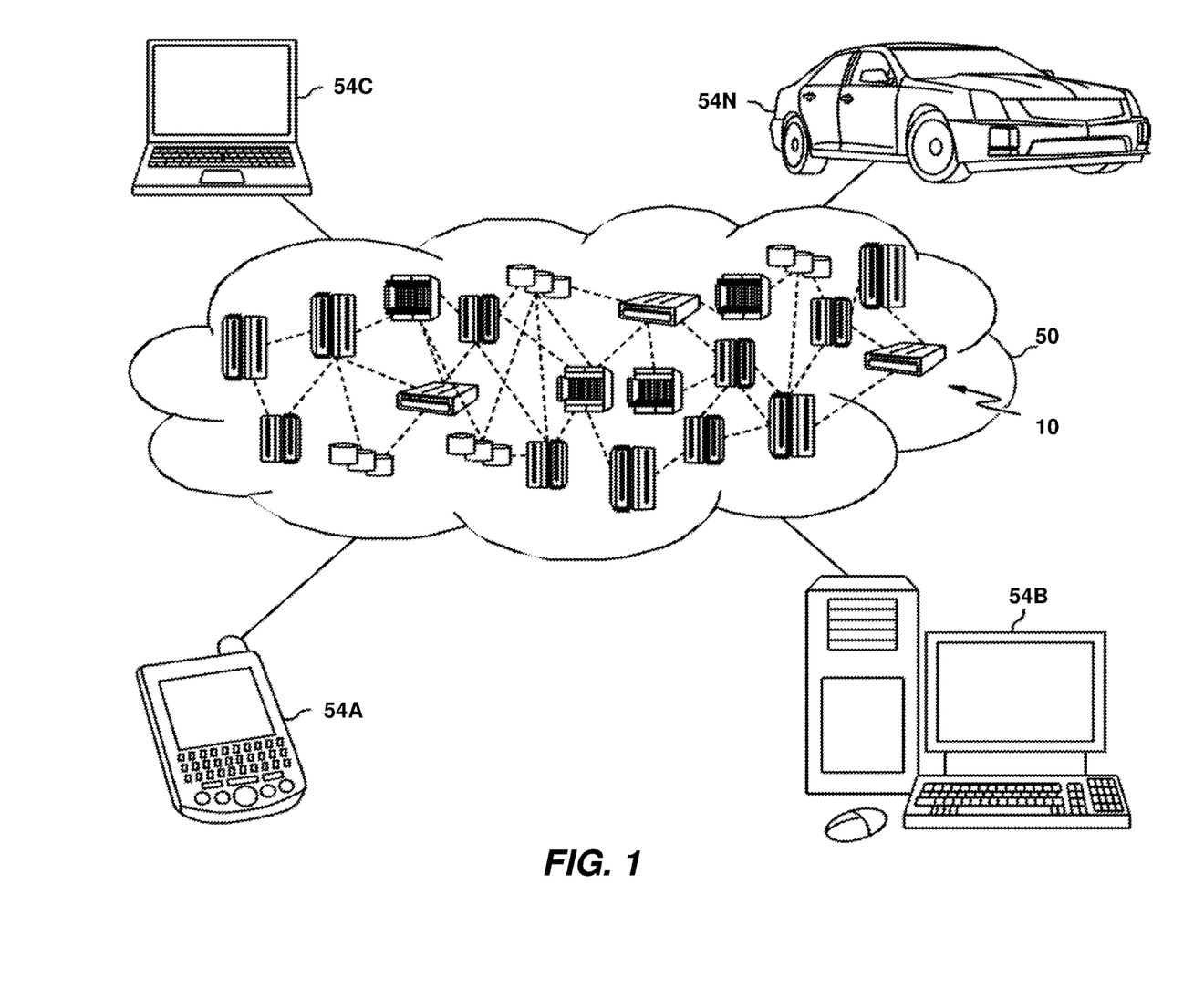
FIG. 1 depicts a cloud computing environment according to one or more embodiments of the present invention.

Referring now to FIG. 1, illustrative cloud computing environment 50 is depicted. As shown, cloud computing environment 50 includes one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms, and/or software as services for which a cloud consumer does not need to maintain resources on a local computing device. It is understood that the types of computing devices 54A-N shown in FIG. 1 are intended to be illustrative only and that computing nodes 10 and cloud computing environment 50 can communicate with any type of computerized device over any type of network and/or network addressable connection (e.g., using a web browser).

Figure 2:
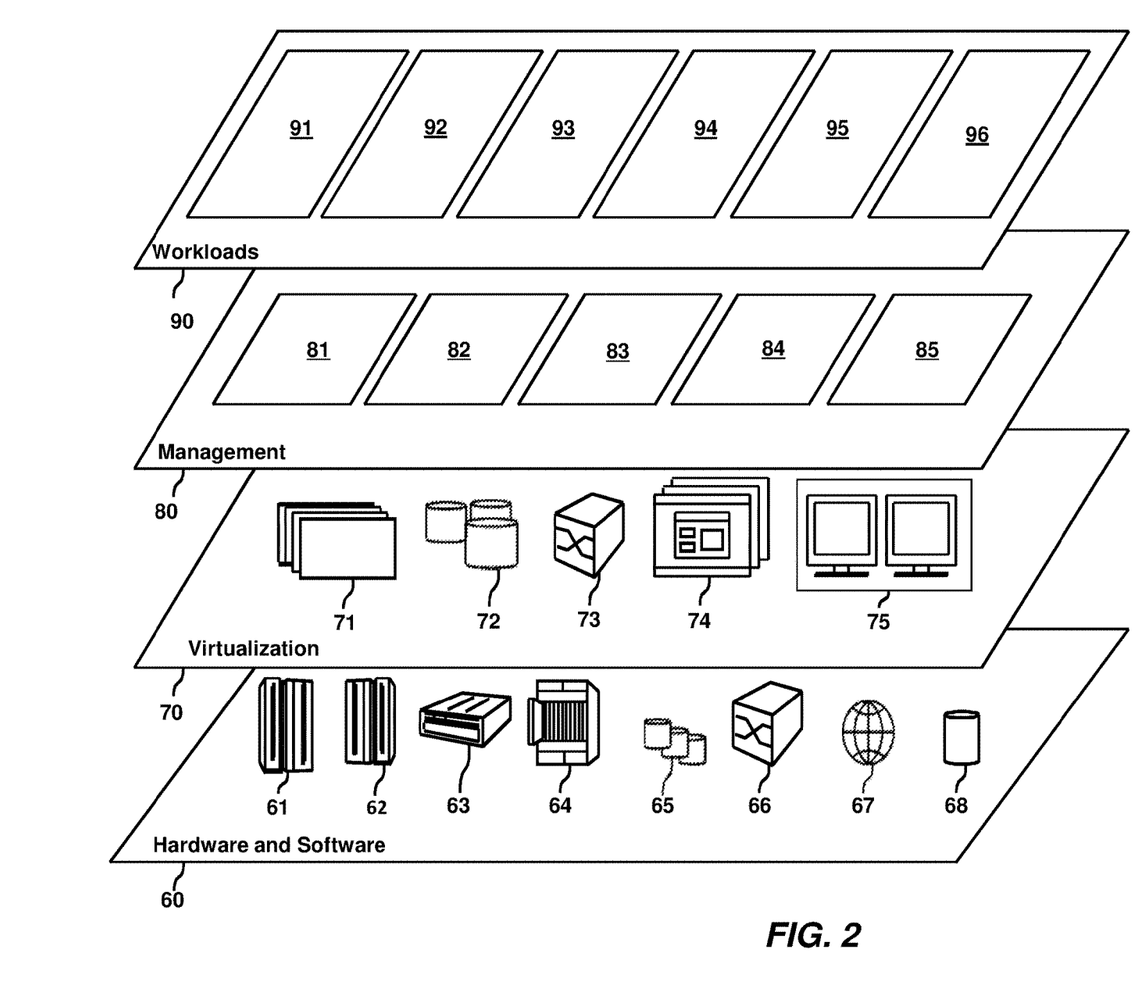
FIG. 2 depicts abstraction model layers according to one or more embodiments of the present invention.

Referring now to FIG. 2, a set of functional abstraction layers provided by cloud computing environment 50 (FIG. 1) is shown. It should be understood in advance that the components, layers, and functions shown in FIG. 2 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and simulation processing 96.

Turning now to an overview of technologies that are more specifically relevant to aspects of the invention, as noted above, simulation runs are often used to verify the functionality of complex processor and system designs. One characteristic that may be desirable of such tests is to minimize system calls to external tracers and monitors such that the tests maximize compute resources that are expended on the actual simulation. Within these type of simulation runs, the creation of bus trances may be delayed until the end of the simulation. In some situations, the examination of the created bus traces occurs in limited situations. For example, in some scenarios, bus traces are examined if there is a fail or some other compelling reason to examine the run.

In some debug scenarios, to debug a simulation fail and determine the source of the problem, the simulation is rerun using a checkpoint prior to the fail and a predefined set of signals, comprising major system buses, is used to capture a trace such as an All Event Trace (AET) up to the point of fail. U.S. Pat. No. 5,327,361 illustrates one such example AET. As understood by those having ordinary skill in the art, other suitable types of traces may be implemented. In some scenarios, the fail captured by the traces fail can be viewed with a waveform viewer. In some scenarios, an AET for the various system buses are parsed to generate a text listing of each bus with cycle times showing all bus operations taking place.

Although the creating of such bus traces may be based on a straight forward approach of identifying and parsing fixed fields and control signals that can be decoded to generate the listings, such bus traces may face various technical problems. For example, bus interface designs have started trending toward layered designs where at the lowest physical layer the bus is a simple data bus with minimal control. In higher levels of the bus, the level defines how to interpret raw data into bus fields and control. The PCIe bus is an example of such a bus. Low-level buses may define a set data packet as the basic unit transferred with a physical width of the bus being implementation dependent. To transfer a data packet may require sending n data beats where n is the quotient of the data packet width divided by the physical bus width. As such, in some scenarios at a lowest level, an AET may only show the physical data bus and an associated valid bit.

The parsing utilized by the debugging process identified above may pose a technical difficulty because an AET that begins a trace at some point in the middle of a simulation run will lack information sufficient to identify to which of the data beats represents the start of a data packet. Rather, to decode such a bus, a data beat may be picked and assumed to be the start of a data packet. After several data packets are assembled and decoded, the packets are then examined to see if the decoded packets are valid. If fields contain invalid data, then in some scenarios it may be concluded the selected data beat was not the start of a data packet. The next data beat may then be selected and the process may again be repeated until there is confidence that the correct start of the data packet has been found.

The debugging process set forth above may be further complicated as a result of not all data packets containing control information to be decoded, some contain raw data. As such, even if the correct data beat is found, decoding raw data may lead to the conclusion that this is not the start of a data packet.

In order to decode such a bus with certainty, in some scenarios, an AET would need to be captured from the start where the first data packet is seen as such first packet is often the start of the data packet. Similarly, as the first data packet is often a control packet that contains information, such control information can be used to identify when the next control packet will be seen (e.g., indication that packets are raw data and are not control). Otherwise, a data packet would need to be picked and assumed to be the start of a data packet and then decoding would be started. If the decoding does not decode correctly, then a conclusion would be made that the selected data packet was not the start of a data packet and the process is repeated with the next data beat. This continues until you have confidence you have found a true start of a data packet.

The above decoding solution have practical drawbacks as a result of limited computational resources. For example, although a simulation run may cover hundreds of millions of cycles but it may be technologically practical to only create an AET that covers less than the full range (e.g., thousands of cycles or possibly millions of cycles of the hundreds of millions of cycles). As such it may be a waste of computational resources to capture an AET from the beginning if the area of interest is located hundreds of millions of cycles later.

Turning now to an overview of the aspects of the invention, one or more embodiments of the invention address the above-described shortcomings of the prior art by modifying a simulation model by adding additional logic that is able to observe, processes, and/or track events in a logic design such that it is compiled as part of the design itself rather than as external logic compiled separately peeking into the design and then processing that information.

Figure 3:
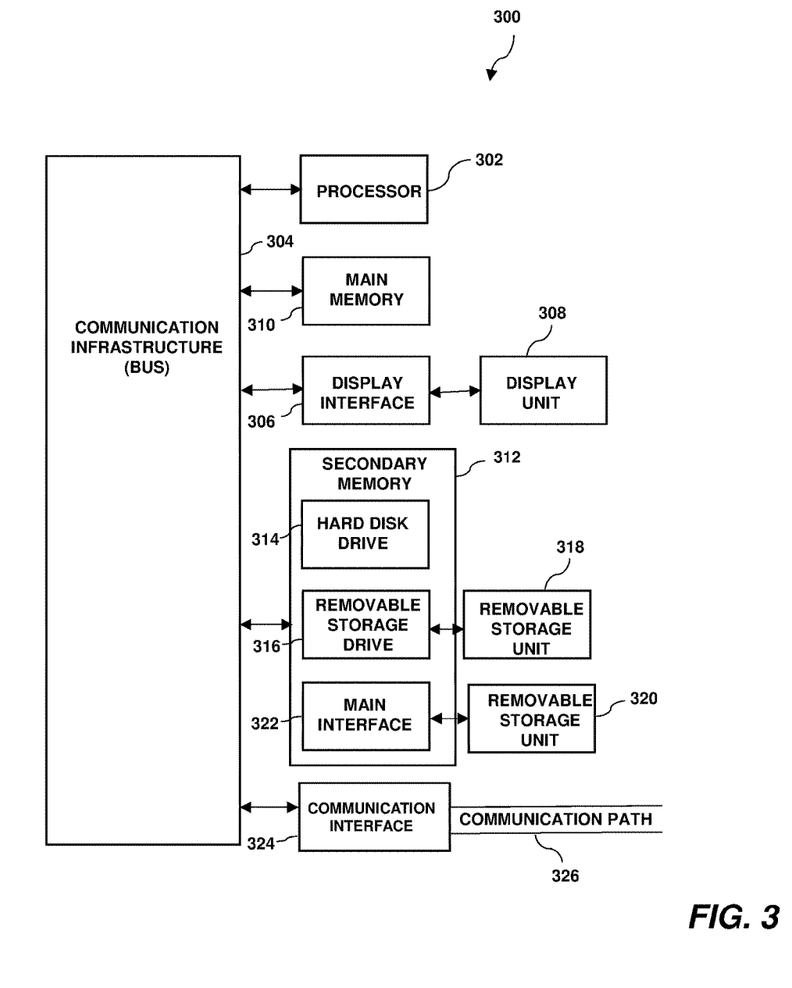
FIG. 3 depicts an exemplary computer system capable of implementing one or more embodiments of the present invention.

Turning now to a more detailed description of aspects of the present invention, FIG. 3 illustrates a high-level block diagram showing an example of a computer-based system 300 that is useful for implementing one or more embodiments of the invention. Although one exemplary computer system 300 is shown, computer system 300 includes a communication path 326, which connects computer system 300 to additional systems and may include one or more wide area networks (WANs) and/or local area networks (LANs) such as the internet, intranet(s), and/or wireless communication network(s). Computer system 300 and additional systems are in communication via communication path 326, (e.g., to communicate data between them).

Computer system 300 includes one or more processors, such as processor 302. Processor 302 is connected to a communication infrastructure 304 (e.g., a communications bus, cross-over bar, or network). Computer system 300 can include a display interface 306 that forwards graphics, text, and other data from communication infrastructure 304 (or from a frame buffer not shown) for display on a display unit 308. Computer system 300 also includes a main memory 310, preferably random access memory (RAM), and may also include a secondary memory 312. Secondary memory 312 may include, for example, a hard disk drive 314 and/or a removable storage drive 316, representing, for example, a floppy disk drive, a magnetic tape drive, or an optical disk drive. Removable storage drive 316 reads from and/or writes to a removable storage unit 318 in a manner well known to those having ordinary skill in the art. Removable storage unit 318 represents, for example, a floppy disk, a compact disc, a magnetic tape, or an optical disk, etc., which is read by and written to by a removable storage drive 316. As will be appreciated, removable storage unit 318 includes a computer readable medium having stored therein computer software and/or data.

In some alternative embodiments of the invention, secondary memory 312 may include other similar means for allowing computer programs or other instructions to be loaded into the computer system. Such means may include, for example, a removable storage unit 320 and an interface 322. Examples of such means may include a program package and package interface (such as that found in video game devices), a removable memory chip (such as an EPROM or PROM) and associated socket, and other removable storage units 320 and interfaces 322 which allow software and data to be transferred from the removable storage unit 320 to computer system 300.

Computer system 300 may also include a communications interface 324. Communications interface 324 allows software and data to be transferred between the computer system and external devices. Examples of communications interface 324 may include a modem, a network interface (such as an Ethernet card), a communications port, or a PCM-CIA slot and card, etc. Software and data transferred via communications interface 324 are in the form of signals which may be, for example, electronic, electromagnetic, optical, or other signals capable of being received by communications interface 324. These signals are provided to communications interface 324 via communication path (i.e., channel) 326. Communication path 326 carries signals and may be implemented using a wire or cable, fiber optics, a phone line, a cellular phone link, an RF link, and/or other communications channels.

In the present disclosure, the terms "computer program medium," "computer usable medium," and "computer readable medium" are used to generally refer to media such as main memory 310 and secondary memory 312, removable storage drive 316, and a hard disk installed in hard disk drive 314. Computer programs (also called computer control logic) are stored in main memory 310, and/or secondary memory 312. Computer programs may also be received via communications interface 324. Such computer programs, when run, enable the computer system to perform the features of the present disclosure as discussed herein. In particular, the computer programs, when run, enable processor 302 to perform the features of the computer system. Accordingly, such computer programs represent controllers of the computer system.

Figure 4:
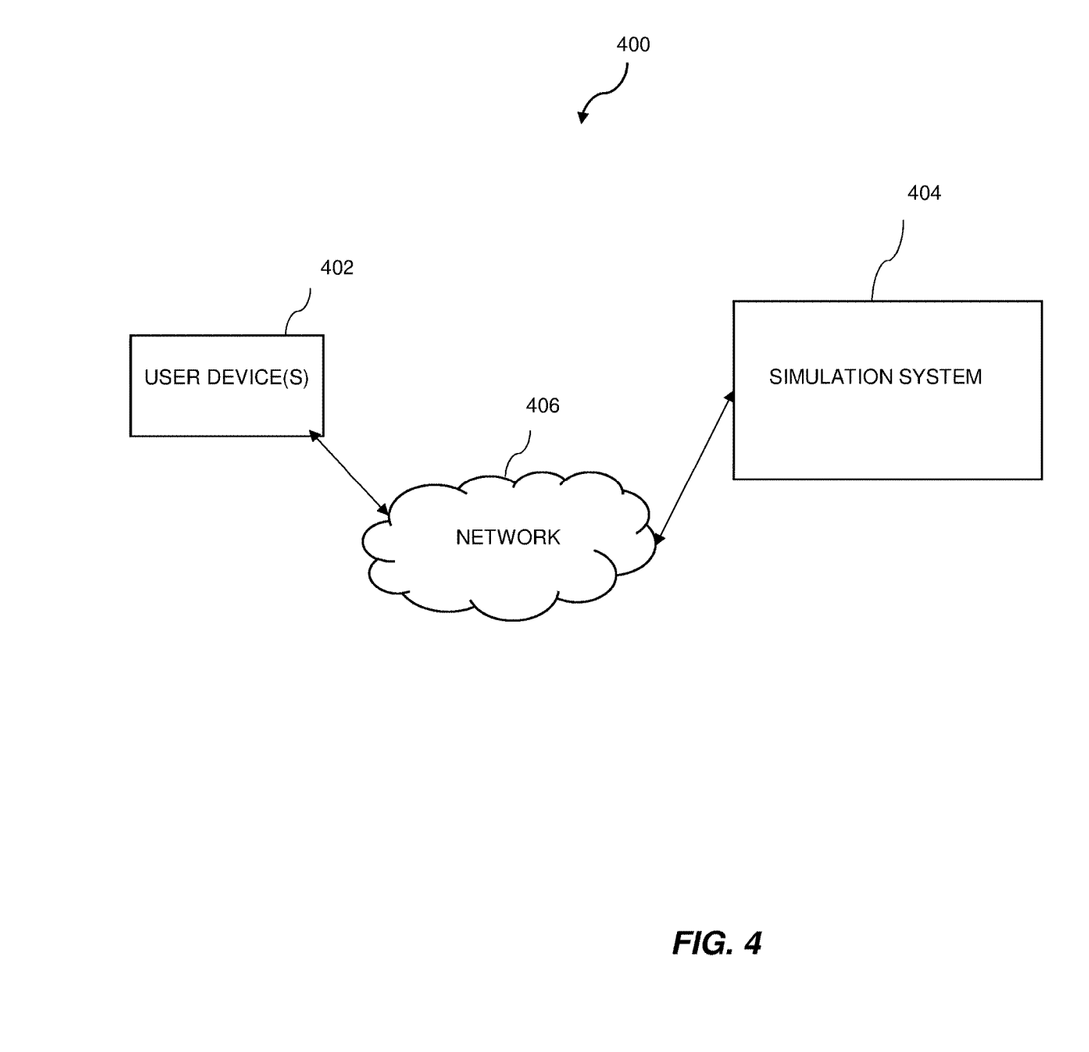
FIG. 4 depicts an exemplary distributed environment in accordance with one or more embodiments of the present invention.

Referring now to FIG. 4, an example distributed environment 400 is presented for the simulation environment. Distributed environment 400 includes one or more user devices 402 and a simulation system 404, which are interconnected via network 406. FIG. 4 provides an illustration of only one example system and does not imply any limitation with regard to other systems in which different embodiments of the present invention may be implemented. Various suitable modifications to the depicted environment may be made, by those skilled in the art, without departing from the scope of the invention as recited by the claims.

In some embodiments of the present invention, simulation system 404 is a standalone computing device, a management server, a web server, a mobile computing device, or other suitable electronic device and/or computing system capable of receiving, sending, and processing data. In some embodiments of the present invention, simulation system 404 is a server computing system utilizing multiple computers, such as in cloud computing environment 50. In some embodiments of the present invention, simulation system 404 is a laptop computer, a tablet computer, a netbook computer, a personal computer (PC), a desktop computer, a personal digital assistant (PDA), a smartphone, or other suitable programmable electronic device capable of communicating with user device 402 and other computing devices (not shown) within distributed environment 400 via network 406. In some embodiments of the present invention, simulation system 404 is a computing system utilizing clustered computers and components (e.g., database server computers, application server computers, etc.) that act as a single pool of seamless resources that are accessible within distributed environment 400. Simulation system 404 may have internal and external hardware components, such as those depicted and described above with respect to FIG. 3.

Network 406 can be, for example, a telecommunications network, a local area network (LAN), a wide area network (WAN), such as the Internet, or a combination of the three, and can include wired, wireless, or fiber optic connections. Network 406 can include one or more wired and/or wireless networks that are capable of receiving and transmitting data, voice, and/or video signals, including multimedia signals that include voice, data, and video information. In general, network 406 can be any suitable combination of connections and protocols that can support communications between user device 402 and simulation system 404, and/or other computing devices (not shown) within a distributed environment 400. In some embodiments of the present invention, distributed environment 400 is implemented as part of a cloud computing environment such as cloud computing environment 50 (FIG. 1).

User device 402 is configured to allow users to send and/or receive information to user device 402 from simulation system 404. In some embodiments of the present invention, user device 402 is configured to capture and/or present text, audio, images, and/or video to the user (e.g., via a microphone, camera, display of user device 402).

In some embodiments of the present invention, user device 402 is a laptop computer, a tablet computer, a netbook computer, a personal computer (PC), a desktop computer, a personal digital assistant (PDA), a smartphone, an internet-of-things (IoT) enabled device, a VR/Augmented Reality (AR) display device, and/or other suitable programmable electronic devices capable of communicating with various components and devices within distributed environment 400. In some embodiments of the present invention, user device 402 comprises two or more separate devices. In some embodiments of the present invention, user device 402 is a programmable electronic mobile device or a combination of programmable electronic mobile devices capable of executing machine readable program instructions and communicating with other computing devices (not shown) within distributed environment 400. In some embodiments of the present invention, user device 402 may include internal and external hardware components, such as those depicted and described above with respect to FIG. 3.

In general, simulation system 404 is a simulation tool that is able to generate and add additional control information to a logic under test of a designed processor and/or system to facilitate debugging and comprehension of a simulation without the need to add actual logic to the underlying design model (e.g., logic source files being simulated). In particular, in some embodiments of the present invention, simulation system 404 is configured to implement one or more state-machines to monitor a certain set of additional signals of a system bus, and decoding the simulation based at least in part on the monitored additional signals. For example, in some embodiments of the present invention, a first signal (e.g., a "data_pkt_start") is monitored, in which the first signal is associated with a data valid signal of a first data beat of a data packet. This first signal allows for the elimination of any ambiguity as to where a data packet starts. In some embodiments of the present invention, a second signal (e.g., "control_not_data") is monitored, in which the second signal is sampled only when the first signal is valid. The second signal provides an indication if the data packet contains control information or raw data. With these two additional signals, a bus could be correctly decoded regardless of when AET execution begins.

In some embodiments of the present invention, a simulation tool such as the simulation tool described in U.S. Pat. No. 6,195,627 is utilized, which allows for access of signals within a design even across hierarchies (hereinafter "Bugspray" tool). In some embodiments of the present invention, the simulation tool allows for designer creation of instrumentation modules in a hardware description language (HDL). Various other suitable types of simulation tools may be utilized as understood by those having ordinary skill in the art. The Bugspray tool allows for logic to be added using access signals as inputs in a manner that has no impact on the actual design logic and which only exists in the simulation model but not the actual logic used in the physical design. The Bugspray tool may be utilized to count the occurrence of events or making performance measures. The Bugspray tool allows for the creation of latches and thus a state-machine may be utilized to implement the additional logic. For example, the state-machine may be utilized to identify a clock and/or clocks used by the latch. In some embodiments of the present invention, the clocks used by the latch will be the same clocks associated with latches driving or receiving the signals of interest.

In some embodiments of the present invention, simulation system 404 is configured to utilize a simulation tool such as Bugspray to generate additional logic that allows for access of the first and/or second signals within the design. Simulation system 404 is configured to generate the first and second signals via the use of a state-machine. In some embodiments of the present invention, the state-machine is configured to identify a first data beat. In some embodiments of the present invention, the state-machine is configured to not only identify the first data beat but identify all data beats. Simulation system 404 is configured to generate the second signal based on the identification performed via the state-machine. The additional logic is logic which is to be simulated as part of the design being tested. The additional logic does not exist in real logic and thus has no impact on any logic being tested. Rather, the additional logic only monitors existing logic and tracks it via state-machines.

In some embodiments of the present invention, simulation system 404 is configured to rebuild the simulation model based on the generated additional logic. Simulation system 404 is configured to examine a netlist of the simulation model and identify the signals created with the Bugspray logic. Simulation system 404 is configured to add the signals to the list of signals that are to be captured when an AET is generated. Simulation system 404 is configured to run the simulation and generate an AET for a portion of interest. The AET will have the new signals generated. In some embodiments of the present invention, the Bugspray logic is implemented within a VHSIC Hardware Description Language (VHDL) wrapper. In some embodiments of the present invention, the hierarchy of the VHDL wrapper is different from a hierarchy of the logic of the underlying model source file. In some embodiments of the present invention, the Bugspray logic is added at the same hierarchy or above any signals which are to be accessed Consider the following example scenario for running a simulation and generating an AET for an area of interest based on signals of a low-level data bus. This scenario is provided for illustrative purposes to provide further detail regarding certain steps that may be performed by simulation system 404. In this example, a physical level bus has a data_valid signal and a data_beat (127:0) bus has data for one beat of a data packet comprised of 4 data beats. In this example, the data packet is 512 bits wide, (511:0). Data is sent on the data_beat (127:0) bus and is only valid when the data_valid signal is active. In some embodiments of the present invention, there are no rules regarding when data beats will be driven so there may be data beats sent back-to-back or sent with one or more cycles in which the data_valid is inactive. In some embodiments of the present invention, there may or may not be unused cycles between data beats of one packet and those of another.

In this example scenario, the first data packet that is sent will be a control packet. The control packet is a 4 bit Data Length field that is located in bits (451:448) of the data packet. The Data Length field indicates when the next control packet is expected to arrive. If the value of the Data Length field is 0 then the next data packet will be a control. If the value of the Data Length field is non-zero, then there will be that number of raw data sent in the data packet before the next control packet is detected. Using this information, the logic is generated to indicate if a data packet contains control or raw data may be generated.

In this example scenario, the data bus includes the following set of input logic signals of interest: (a) data_valid: std_ulogic, which indicates that data_beat contains valid data; (b) data_beat: std_ulogic_vector (127 down to 0), which identifies one of the four data beats of the data packet; and (c) clk:std_ulogic, which is a reference clock used by the logic driving these signals (e.g., driven on rising edge).

Figure 5:
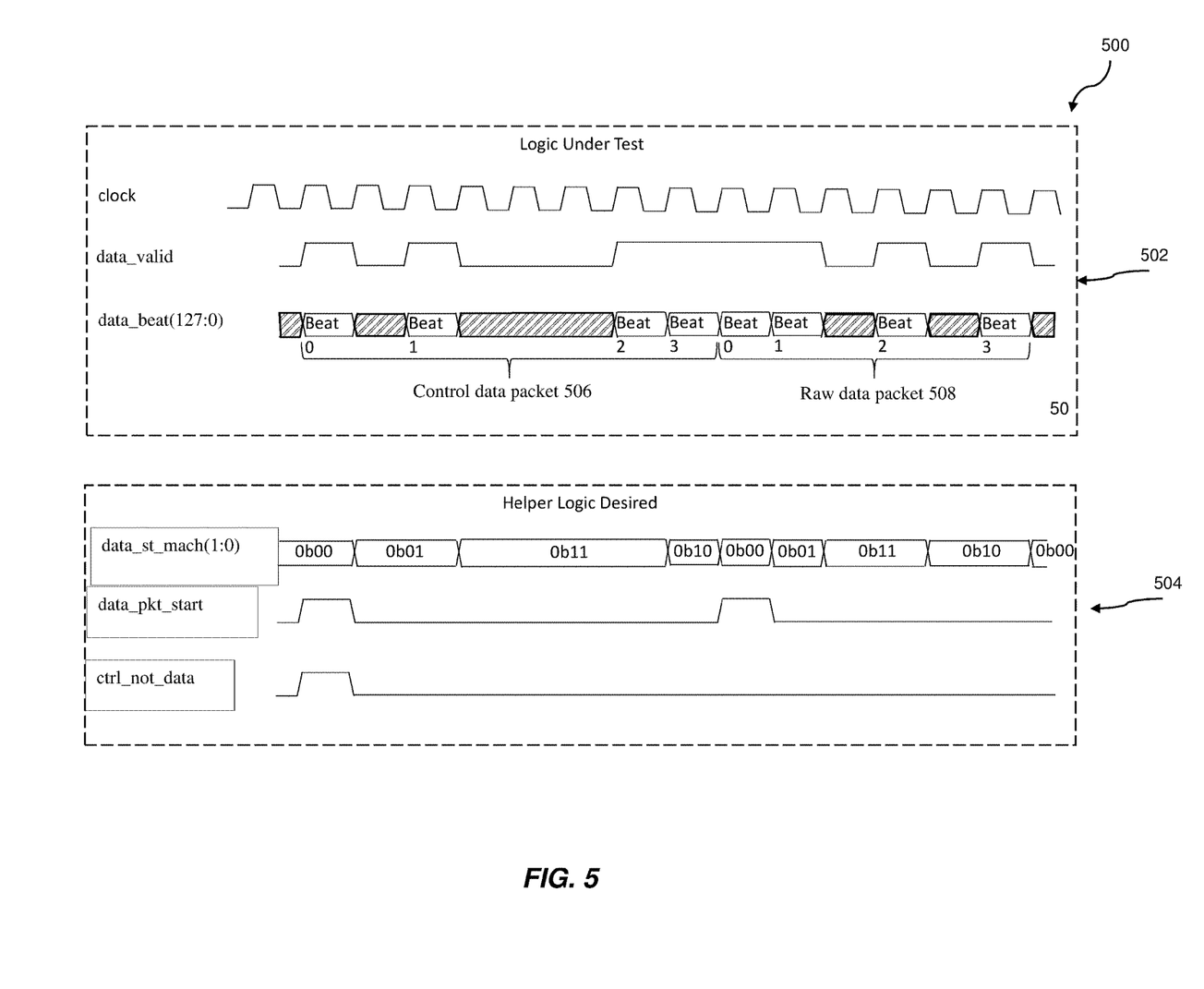
FIG. 5 depicts an timing diagram of an exemplary data bus in accordance with one or more embodiments of the present invention.

In this example scenario, a set of output signals of interest that are to be obtained based on the logic signals of interest includes: (a) data_pkt_start:std_ulogic, in which the signal is valid when data_valid of the data beat is the first beat of a data packet; (b) control_not_data:std_ulogic, in which the signal is valid when data_pkt_start is active, in which a value of one indicates that packet is a control packet FIG. 5 illustrates a timing diagram 500 for the example scenario above, in which a first portion 502 of timing diagram 500 is of the data bus in an existing logic under test, in which a second portion 504 of timing diagram 500 is of the additional desired logic. First portion 502 of timing diagram 500 includes a first packet transfer 506 and a second packet transfer 508, in which the first packet transfer 506 is a control packet transfer, in which the second packet transfer 508 is a data packet transfer. Second portion 504 shows behavior of the desired additional control signals (e.g., data_pkt_start, control_not_data, etc.). Second portion 504 also shows a signal indicative of the current state of a synchronous state-machine that tracks the data beats (e.g., data_st_mach).

Figure 6:
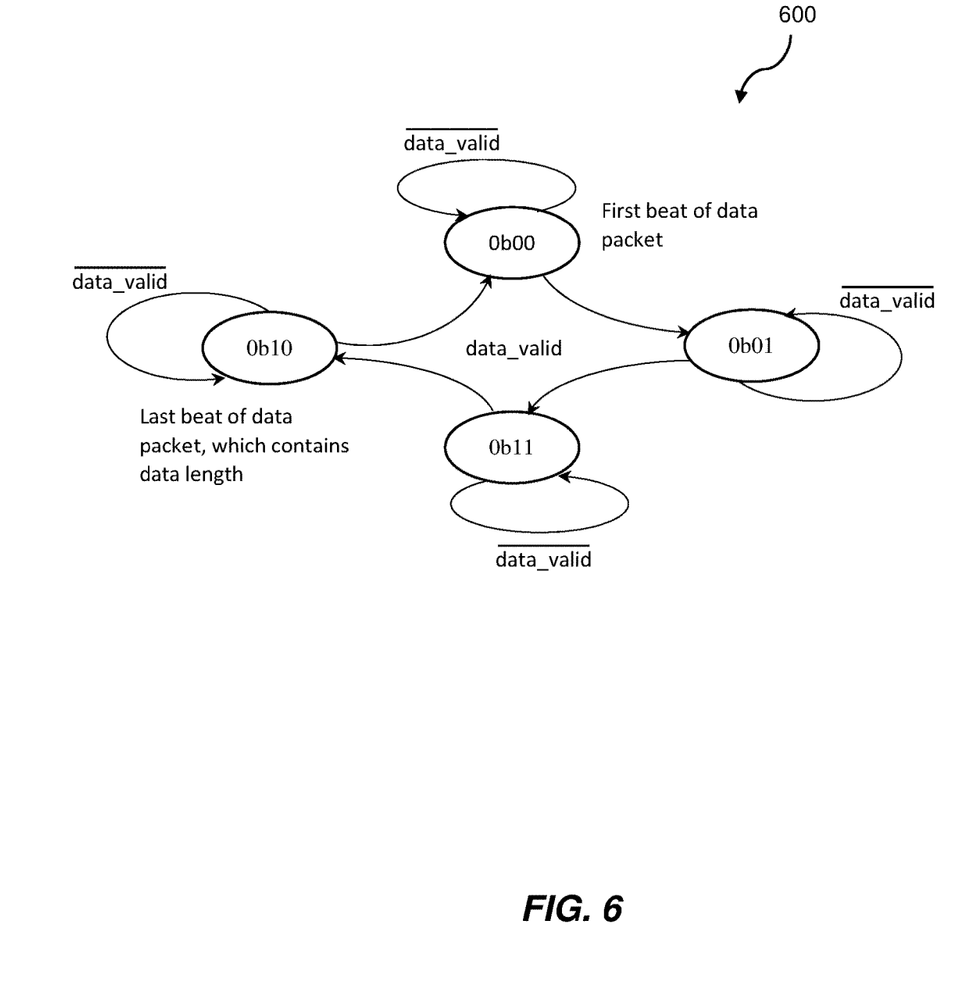
FIG. 6 depicts a diagram of an exemplary synchronous state-machine in accordance with one or more embodiments of the present invention.
Figure 7:
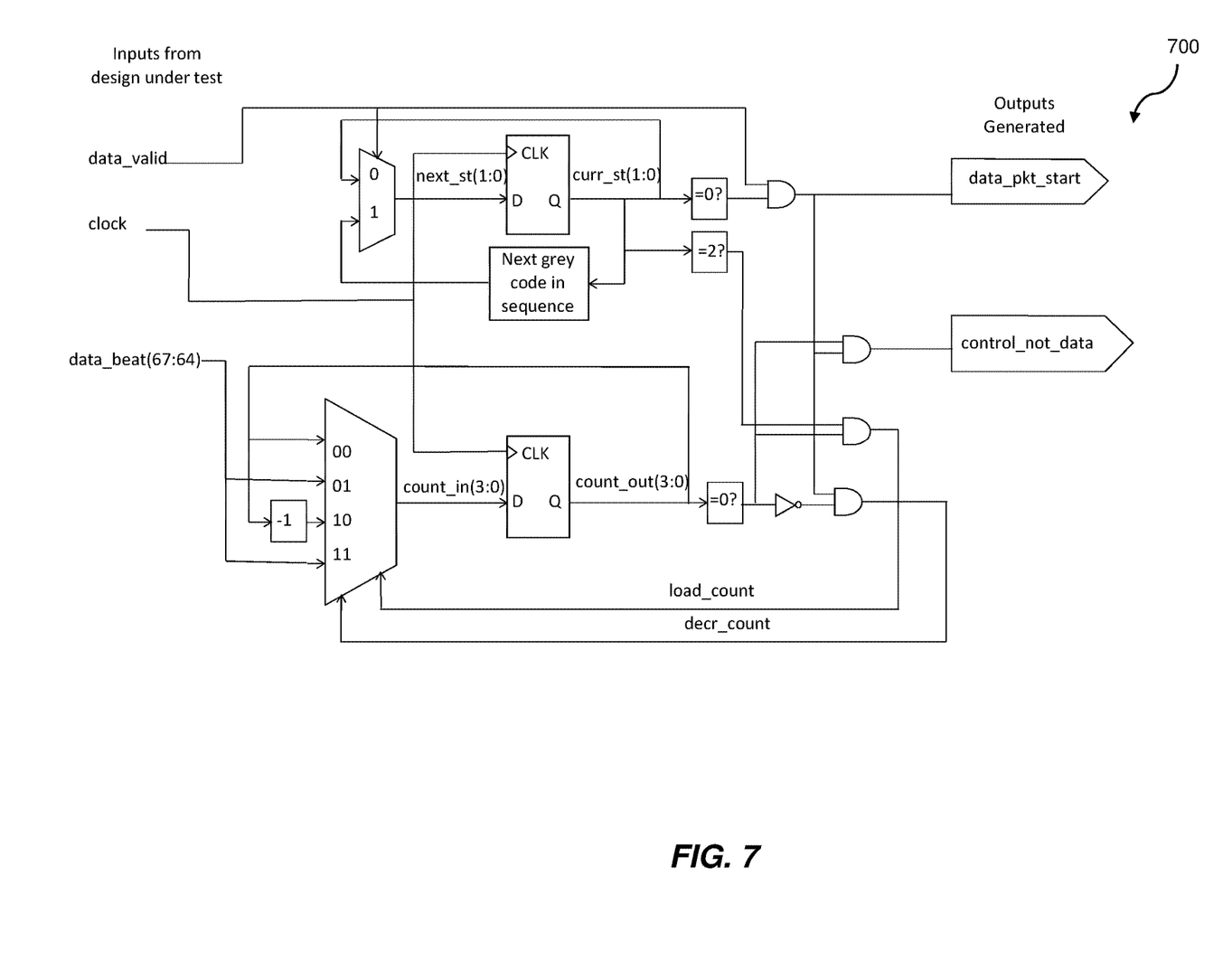
FIG. 7 depicts a diagram of exemplary logic for implementing the synchronous state-machine of FIG. 5 in accordance with one or more embodiments of the present invention.

FIG. 6 illustrates a diagram of an exemplary synchronous state-machine 600 in accordance with one more embodiments of the present invention. State 0b00 is the first beat of the data packet. The state-machine advances to the next state on the next data_valid seen, otherwise the state-machine waits in the current state. To track the type of packet, the logic relies on the fact that the first packet sent must be a control packet. The Data Length field is located in bits (451:448) of the data packet which is bits (67:64) of the 4th data packet. The value of the Data Length field is captured for every control packet. The value is decremented each time data_pkt_start is active. If the counter is zero when a data_pkt_start is active, then the packet is a control packet otherwise the packet is a raw data packet. FIG. 7 illustrates exemplary logic 700 for implementing the synchronous state-machine and the data length decrementer of FIG. 6 in accordance with one or more embodiments of the present invention.

Figure 8:
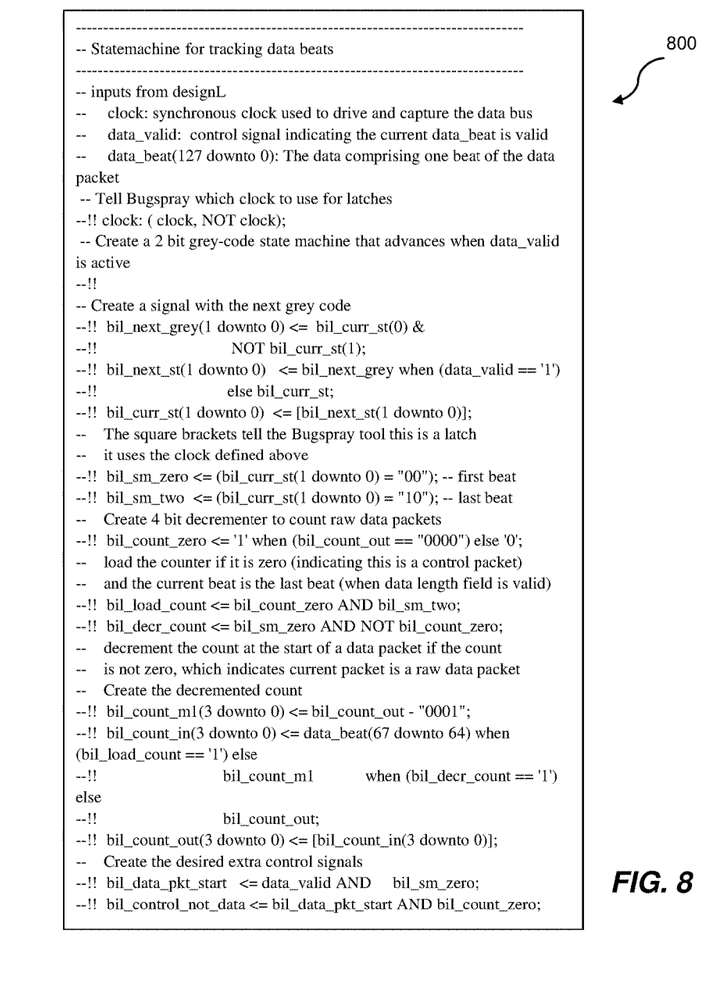
FIG. 8 depicts a diagram of exemplary code for creating the logic of FIG. 7 in accordance with one or more embodiments of the present invention.

FIG. 8 illustrates exemplary code 800 of a simulation tool (e.g., Bugspray code) for creating the logic shown in FIG. 7 in accordance with one or more embodiments of the present invention. In this example, all are prefixed with "bil_" for ease of readability and to avoid any potential name conflicts. Bugspray code is prefixed with "--##". The first "--" is a VHDL comment marker which allows for this code to be seen as comments and have no impact on the physical design of this logic. When the Bugspray code is invoked as part of the model build process (e.g., by simulation system 404 of FIG. 4), and the above prefix is recognized to automatically identify what code to pull out and compile.

Referring back to FIG. 4, once the additional logic (e.g., additional Bug spray logic) has been created, in some embodiments of the present invention, simulation system 404 is configured to rebuild the simulation model based on the additional logic. In some embodiments of the present invention, simulator 404 is configured to test whether the simulation model was rebuilt without generating errors. In some embodiments of the present invention, simulator system 404 is configured to identify from the rebuilt simulation model the additional signals that were created by the additional logic and then add the identified additional signals to the list of signals that will be captured when an AET is generated. In some embodiments of the present invention, simulator system 404 is configured to identify the additional signals by examining a netlist of the rebuilt simulation model. For example, in the context of example Bugspray logic 800 of FIG. 8, simulation system 404 may find the following example signals in the model netlist of the rebuild simulation model and then add these signals to the list of signals used when generating an AET: "SOME.HEIRARCHY.B#S.BIL_DATA_PKT_START" and "SOME.HEIRARCHY.B#S.BIL_CONTROL_NOT_DATA."

By adding signals, such as the above, to the list of signals that are used when generating an AET, simulation system 404 is able to simplify the code that would be required for an AET parser to work in a practical manner. The AET parser is able to now read the signals from the improved AET for a particular system bus, decode all bus transactions of the system bus, and present the decoded bus transactions as a text listing of activity. In some embodiments of the present invention, the text listing is presented to a user via a display associated with the user (i.e., via user device 402).

Although one example implementation is set forth in FIGS. 5-8, other suitable implementations may be applied that utilize one or more of the described techniques to address situations where additional information is desired about logic under test but does not exist in the actual logic. Similarly, although the example above identifies specific tools such as an AET and Bugspray, other suitable tools which can view waves captured during simulation may be utilized in one or more embodiments of the present invention. For example, in some embodiments of the present invention, additional logic may be added as part of a simulation test bench. Although some wave viewers can perform combinatorial logic on displayed signals, wave viewers are unable to create a synchronous state-machine.

Figure 9:
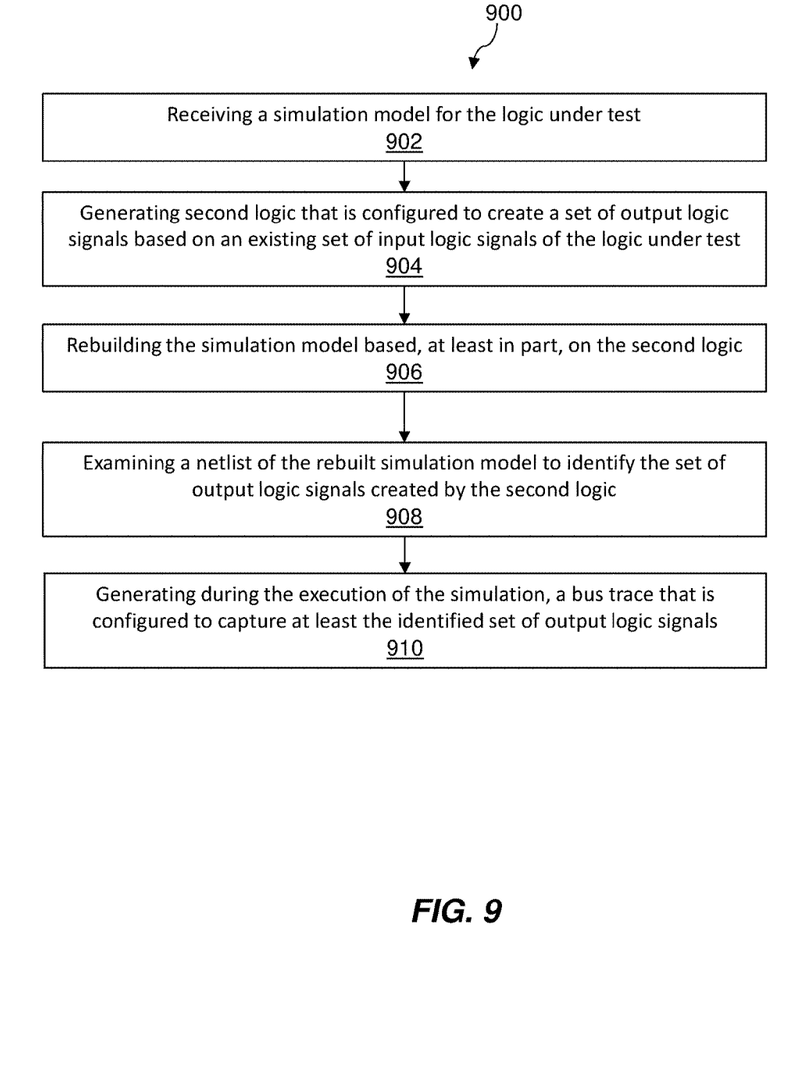
FIG. 9 depicts a flow diagram illustrating a methodology in accordance with one or more embodiments of the present invention.

Additional details of the operation of simulation system 404 will now be described with reference to FIG. 9, in which FIG. 9 depicts a flow diagram illustrating a methodology 900 executed by the simulation system 404 according to one or more embodiments of the present invention. At block 902, a simulation model for logic under test is received (e.g., via simulation system 404). At block 904, second logic is generated that is configured to create a set of output logic signals based on an existing set of input logic signals of the logic under test. At block 906, the simulation model is rebuilt based, at least in part, on the second logic. At block 908, a netlist of the rebuilt simulation model is examined to identify the set of output logic signals created by the second logic. At block 910, a bus trace is generating during the execution of the simulation, in which the bus trace is configured to capture at least the identified set of output logic signals.

In some embodiments of the present invention, the existing set of input logic signals includes data beat signal (e.g., data_valid: std_ulogic), a data valid signal (e.g., data_beat: std_ulogic_vector (127 down to 0)), and/or clock signal (e.g., clk:std_ulogic).

In some embodiments of the present invention, the set of output logic signals created by the second logic includes a data packet start signal (e.g., data_pkt_start:std_ulogic) and a control not data signal (e.g., control__not_data:std_u-logic). In some embodiments of the present invention, the data packet start signal is valid when the data valid signal is associated with a first beat of a data packet. In some embodiments of the present invention, the control not data signal is valid when the data packet start signal is active. In some embodiments of the present invention, generating of the second logic includes implementing a state-machine that is configured to track data beats of the data packet. In some embodiments of the present invention, the second logic is implemented as a VHDL wrapper.

In some embodiments of the present invention, the generating of the bus trace includes generating an AET for a system bus. In some embodiments of the present invention methodology 900 further includes reading the identified signals that are captured by the AET for the system bus, and decoding bus transactions of the system bus based on the reading.

In some embodiments of the present invention methodology 900 further includes presenting the decoded bus transactions as a text listing of bus activity to a user. In some embodiments of the present invention, the test listing includes cycle times of the bus transactions taking place on the system bus.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method for handling simulation of logic under test, the computer-implemented method comprising:

receiving, by a system comprising one or more processors, a simulation model for the logic under test;

identifying an existing set of input logic signals of the logic under test, the set of input logic signals including a first input logic signal;

generating, by the system, second logic that is configured to create a set of output logic signals based on the identified existing set of input logic signals of the logic under test, the set of output logic signals including a first output logic signal configured to generate a first valid state in response to the first input logical state being associated with a data beat and a second output logic signal configured to generate a second valid state in response to the first output logic signal being active, wherein the set of output logic signals created by the second logic includes a data packet start signal and a control not data signal, wherein the data packet start signal is valid when the data valid signal is associated with a first beat of a data packet, wherein the control not data signal is valid when the data packet start signal is active;

rebuilding, by the system, the simulation model based, at least in part, on the second logic;

examining, by the system, a netlist of the rebuilt simulation model to identify the set of output logic signals created by the second logic;

executing, by the system, a simulation based on the rebuilt simulation model; and generating, by the system, during the execution of the simulation, a bus trace that is configured to capture at least the identified set of output logic signals, wherein the existing set of input logic signals includes a data beat signal, a data valid signal, and a clock signal.

2. The computer-implemented method of claim 1, wherein the generating of the second logic includes implementing a state-machine that is configured to track data beats of the data packet.

3. The computer-implemented method of claim 1, wherein the generating of the bus trace comprises generating an All Events Trace (AET) for a system bus, wherein the method further comprises:

reading the identified signals that are captured by the AET for the system bus; and decoding bus transactions of the system bus based on the reading.

4. The computer-implemented method of claim 3 further comprising:
presenting the decoded bus transactions as a text listing of bus activity to a user, wherein the test listing includes cycle times of the bus transactions taking place on the system bus.

5. The computer-implemented method of claim 1, wherein the second logic is implemented as a VHDL wrapper.

6. A computer program product for handling simulation of logic under test, the computer program product comprising a non-transitory computer readable storage medium having program instructions embodied therewith, the program instructions executable by a system comprising one or more processors to cause the system to perform a method comprising:
receiving, by a system comprising one or more processors, a simulation model for the logic under test;
identifying an existing set of input logic signals of the logic under test, the set of input logic signals including a first input logic signal;
generating, by the system, second logic that is configured to create a set of output logic signals based on the identified existing set of input logic signals of the logic under test, the set of output logic signals including a first output logic signal configured to generate a first valid state in response to the first input logical state being associated with a data beat and a second output logic signal configured to a second valid state in response to the first output logic signal being active, wherein the set of output logic signals created by the second logic includes a data packet start signal and a control not data signal, wherein the data packet start signal is valid when the data valid signal is associated with a first beat of a data packet, wherein the control not data signal is valid when the data packet start signal is active;
rebuilding, by the system, the simulation model based, at least in part, on the second logic;
examining, by the system, a netlist of the rebuilt simulation model to identify the set of output logic signals created by the second logic;
executing, by the system, a simulation based on the rebuilt simulation model; and
generating, by the system, during the execution of the simulation, a bus trace that is configured to capture at least the identified set of output logic signals,
wherein the existing set of input logic signals includes a data beat signal, a data valid signal, and a clock signal.

7. The computer program product of claim 6, wherein the generating of the second logic includes implementing a state-machine that is configured to track data beats of the data packet.

8. The computer program product of claim 6, wherein the generating of the bus trace comprises generating an All Events Trace (AET) for a system bus, wherein the method further comprises:
reading the identified signals that are captured by the AET for the system bus; and
decoding bus transactions of the system bus based on the reading.

9. The computer program product of claim 8, wherein the method further comprises:
presenting the decoded bus transactions as a text listing of bus activity to a user, wherein the test listing includes cycle times of the bus transactions taking place on the system bus.

10. The computer program product of claim 6, wherein the second logic is implemented as a VHDL wrapper.

11. A system for handling simulation of logic under test, the system comprising one or more processors configured to perform a method comprising:
receiving, by a system comprising one or more processors, a simulation model for the logic under test;
identifying an existing set of input logic signals of the logic under test, the set of input logic signals including a first input logic signal;
generating, by the system, second logic that is configured to create a set of output logic signals based on the identified existing set of input logic signals of the logic under test, the set of output logic signals including a first output logic signal configured to generate a first valid state in response to the first input logical state being associated with a data beat and a second output logic signal configured to a second valid state in response to the first output logic signal being active, wherein the set of output logic signals created by the second logic includes a data packet start signal and a control not data signal, wherein the data packet start signal is valid when the data valid signal is associated with a first beat of a data packet, wherein the control not data signal is valid when the data packet start signal is active;
rebuilding, by the system, the simulation model based, at least in part, on the second logic;
examining, by the system, a netlist of the rebuilt simulation model to identify the set of output logic signals created by the second logic;
executing, by the system, a simulation based on the rebuilt simulation model; and
generating, by the system, during the execution of the simulation, a bus trace that is configured to capture at least the identified set of output logic signals,
wherein the existing set of input logic signals includes a data beat signal, a data valid signal, and a clock signal.

12. The system of claim 11, wherein the generating of the second logic includes implementing a state-machine that is configured to track data beats of the data packet.

13. The system of claim 11, wherein the generating of the bus trace comprises generating an All Events Trace (AET) for a system bus, wherein the method further comprises:
reading the identified signals that are captured by the AET for the system bus; and
decoding bus transactions of the system bus based on the reading.

14. The system of claim 13, wherein the second logic is implemented as a VHDL wrapper, wherein the method further comprises:
presenting the decoded bus transactions as a text listing of bus activity to a user, wherein the test listing includes cycle times of the bus transactions taking place on the system bus.

* * * * *